United States Patent [19]

Aiello

[11] Patent Number: 5,796,292
[45] Date of Patent: Aug. 18, 1998

[54] CIRCUIT FOR BIASING EPITAXIAL REGIONS WITH A BIAS VOLTAGE THAT IS NOT LOWER THAN GROUND REFERENCE DESPITE POWER SUPPLY DISTURBATION

[75] Inventor: Natale Aiello, Catania, Italy

[73] Assignee: Consorzio per la Ricerca sulla Microelettronica nel Mezzogiorno, Catania, Italy

[21] Appl. No.: 607,611

[22] Filed: Feb. 27, 1996

[30] Foreign Application Priority Data

Feb. 28, 1995 [EP] European Pat. Off. .............. 95830066

[51] Int. Cl.$^6$ ...................................................... H03K 3/01
[52] U.S. Cl. .......................... 327/534; 327/535; 327/545
[58] Field of Search .................................. 327/534, 535, 327/536, 537, 545, 309, 538

[56] References Cited

U.S. PATENT DOCUMENTS

| | | | |
|---|---|---|---|
| 5,239,207 | 8/1993 | Miyamoto et al. | 327/537 |
| 5,546,020 | 8/1996 | Lee et al. | 327/534 |
| 5,631,597 | 5/1997 | Akaogi et al. | 327/536 |
| 5,640,123 | 6/1997 | Akaogi et al. | 327/534 |

FOREIGN PATENT DOCUMENTS

| | | | |
|---|---|---|---|
| A-0 149 065 | 7/1985 | European Pat. Off. | H01L 27/06 |
| A-0 512 605 | 11/1992 | European Pat. Off. | H01L 27/02 |
| WO-A-90 06012 | 5/1990 | WIPO | H02H 11/00 |
| WO-A-93 18550 | 9/1993 | WIPO | H01L 27/02 |

*Primary Examiner*—Timothy P. Callahan
*Assistant Examiner*—Jung Ho Kim
*Attorney, Agent, or Firm*—Wolf, Greenfield & Sacks, PC; James H. Morris

[57] ABSTRACT

A circuit for biasing epitaxial wells of a semiconductor integrated circuit includes a first transistor and a second transistor driven in phase opposition to the first; when the supply voltage is positive, the first transistor, being connected between the power supply and the epitaxial well, is conducting whereas the second transistor is cut off. When, on the contrary, the supply voltage is negative, the second transistor, being connected between the epitaxial well and the ground reference GND, goes into saturation, thereby holding the epitaxial well biased to ground since, at that time, it is the highest potential present on the device. In this way, it becomes possible to always ensure reverse biasing of the parasitic diodes which form at the junctions between the epitaxial wells and the adjacent regions thereto.

11 Claims, 1 Drawing Sheet

5,796,292

CIRCUIT FOR BIASING EPITAXIAL REGIONS WITH A BIAS VOLTAGE THAT IS NOT LOWER THAN GROUND REFERENCE DESPITE POWER SUPPLY DISTURBATION

BACKGROUND OF THE INVENTION

1. Field of the Invention

This invention relates to a circuit for biasing epitaxial wells of an integrated circuit on a substrate of semiconductor material. The invention concerns, particularly but not solely, a circuit for biasing wells which contain passive elements, resistors and capacitors, in order to also provide secure isolation between elements in the same well and/or between different wells should the supply voltage, by its own nature or due to induced disturbation, drop to a lower potential than the ground reference.

2. Discussion of the Related Art

For a better understanding of the phenomenon, reference can be had to FIG. 1, which shows a cross-section through a die of semiconductor material, denoted by 1, comprising a substrate 2 of the P type and two epitaxial wells 3 and 5 of the N type which house two passive elements, in particular a resistor 6 and capacitor 7, in their interiors. The epitaxial wells 3 and 5, if maintained at a higher potential than the adjacent regions of the P type, provide electric isolation from the substrate 2 and between the passive elements 6, 7 themselves. The bias voltage applied to the two wells 3 and 5, denoted by Vb in FIG. 1, actually provides reverse bias for parasitic diodes D1 and D2 present at the junctions between the region of the N type, forming the wells 3 and 5, and the adjacent regions of the P type. To have these diodes D1, D2 reverse biased, the isolation wells are usually connected to the supply potential Vcc, since this would normally be the highest potential available on the integrated device.

However, in certain particular applications, such as driver circuits for fluorescent lamps or electronic transformers, the supply voltage, being sinusoidal in nature, periodically drops below the ground reference. Also, with circuits which operate in environments having significant electrical disturbance, such as motor cars, the supply voltage may undergo sudden positive or negative variations, or even drop, albeit for short periods only, to a lower potential than the ground potential.

In such cases, where the supply voltage goes negative, the parasitic diodes D1 and D2 become forward biased, resulting in a sudden flow of current and large dissipation of power. These factors can seriously harm, not infrequently in an irreparable way, the integrated circuit.

A first technical solution to the above problem consists of applying the supply voltage to the regions to be biased through a forward-biased diode. In this way, the flowing of current from ground back to the power supply can be prevented.

This solution, although quite simple to implement, has some drawbacks. In fact, on the occurrence of a voltage drop of 0.6-0-7 Volts across the diode, the potential applied to the isolation wells would no longer be the highest potential present on the circuit. Accordingly, the reverse biasing of junctions comprised of the well-forming regions and any adjacent regions of the P type biased to the supply voltage Vcc, cannot be ensured. By the use of a diode of the Schottky type having a threshold voltage within the range of 0.2 to 0.3 Volts, that is below the threshold voltage of a standard diode, a closer biasing potential to the supply voltage could be provided. However, the implementation of a Schottky diode on an integrated circuit involves technological steps which are not always compatible with standard manufacturing processes currently in use and whose incorporation to the process would entail complicated and cost-intensive modifications.

A particular circuit for biasing epitaxial isolation wells is described in a European Patent Application, published under No. 92830338.7. That Application addresses in particular the problem of holding the parasitic diode which forms at the junction between the well and the region contained inside the well in the off state in the event that this region, or a portion thereof, becomes connected to a higher potential than that of the isolation well. The proposed circuit comprises two transistors of the PNP type, and its operation may be summarized as follows: during normal operation, a first of the transistors holds the N-well connected to the supply voltage Vcc, while the second transistor is at cutoff; as the P-region within the well is brought to a higher potential than the supply voltage Vcc, the second transistor goes into saturation and connects the isolation well to the P-region.

Under such conditions, the circuit would prevent the parasitic diodes from being turned on in the event of the supply voltage Vcc dropping, even for a short period only, to a lower potential than the ground reference potential. Since the P-regions contained in the N-well, used for implementing passive elements, e.g. resistors, have a terminal connected to ground, such biasing of the isolation well would result in the parasitic diode formed by the P-N junction between the P-region and the isolation N-well being turned on.

Therefore, one object of the present invention is to provide a biasing circuit for epitaxial wells, which has such structural and functional features as to ensure reverse biasing of the parasitic diodes formed by the junctions between the well, of the N type, and regions of the P type adjacent thereto, in the event of the voltage supply to the device dropping, even transiently, to negative values with respect to the ground reference.

SUMMARY OF THE INVENTION

The solutive idea on which the invention stands provides for the use of a first electronic switch, connected between the power supply and the epitaxial well, which is closed while the supply voltage is positive. Under this condition, a second electronic switch, connected between the epitaxial well and a ground reference, would be open because it is driven in phase opposition to the first. On the other hand, as the supply voltage goes negative, the second switch closes to hold the epitaxial well at the ground potential, whereas the first switch opens. That potential now is, in fact, higher than the supply voltage. In this way, reverse biasing of the parasitic diode is always ensured.

BRIEF DESCRIPTION OF THE DRAWINGS

The features and advantages of the device according to the invention will be apparent from the following description of an embodiment thereof, given by way of example and not of limitation with reference to the accompanying drawings, in which.

DETAILED DESCRIPTION

Figure 1:
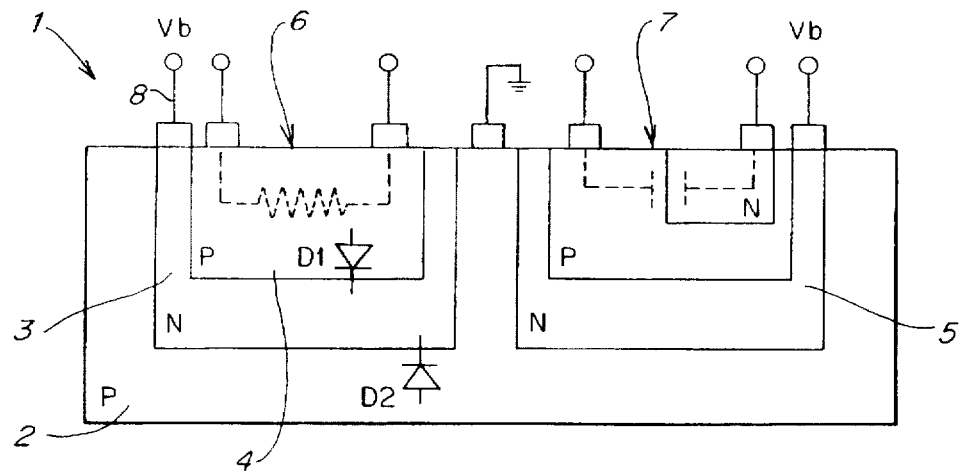
FIG. 1 shows, in vertical section and to an enlarged scale, a portion of a prior art integrated circuit including two epitaxial isolation wells.
Figure 2:
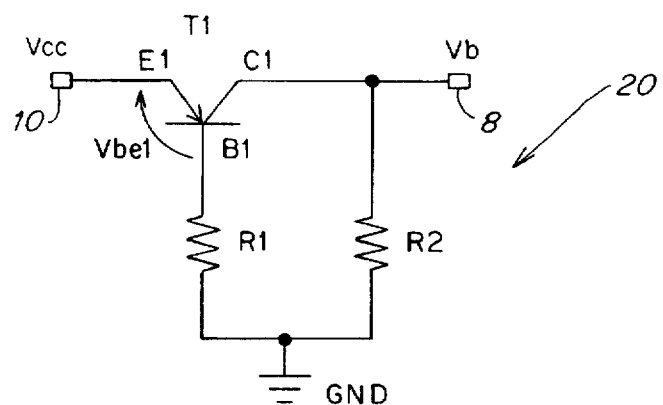
FIG. 2 shows a circuit diagram of a first epitaxial well biasing circuit according to the invention.

With reference to the drawing figures, and in particular to FIG. 2, generally shown at 20 is a circuit illustrating a first embodiment of the biasing structure according to the invention. The structure 20 comprises an electronic switch, implemented by a bipolar transistor T1 of the PNP type, and two resistors R1 and R2. In detail, the transistor T1 has its emitter terminal E1 connected to the supply voltage Vcc, base terminal B1 connected to a first end of one resistor R1 the other end whereof is connected to a ground potential reference GND, and collector terminal C1 connected to a bias contact 8 of an epitaxial well 3. The second resistor R2 has a first end connected to the bias contact 8 of the epitaxial well 3 and a second end connected to ground, GND. The electronic switch T1 could also be implemented by a MOS type transistor, without involving any special modifications to the circuit.

The principle of operation of the structure 20 will now be described. As the voltage at the node 10, corresponding to the supply voltage Vcc, exceeds the value of the voltage Vbe1 present between the emitter E1 and the base B1 of the transistor T1, the latter, having its base terminal B1 connected to ground through the resistor R1, goes into conduction and the node 8, being connected to the bias contact of the well, attains the same potential as the node 10 but for the saturation voltage of the transistor T1, which voltage is on the order of a few tens milliVolts and, therefore, quite low. As the supply voltage, and hence the voltage at the node 10, drops below the conduction threshold of the transistor T1, the transistor is cut off and the epitaxial well biased to ground via the resistor R2. At that time, in fact, the ground potential is the highest available potential, and this biasing allows the parasitic diodes to be held in an off state.

Figure 3:
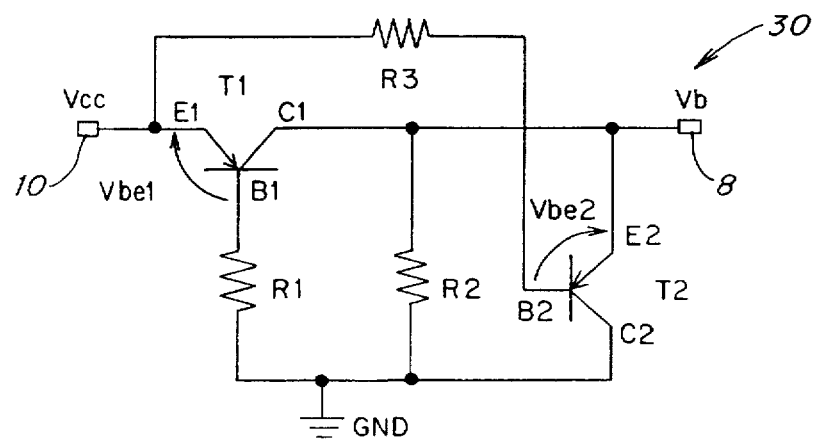
FIG. 3 shows a circuit diagram of a second epitaxial well biasing circuit according to the invention.

FIG. 3 shows a circuit illustrating a second embodiment, generally denoted by the numeral 30, of the biasing structure according to the invention. The structure 30 comprises two electronic switches, each implemented by a bipolar transistor T1, T2 of PNP type, and three resistors R1, R2 and R3. In detail, the transistor T1 has its emitter terminal E1 connected to the supply voltage Vcc, base terminal B1 connected to one end of a first resistor, R1, the other end whereof is connected to a ground potential reference GND, and collector terminal C1 connected to a bias contact 8 of an epitaxial well 3.

The second transistor T2 has its emitter terminal E2 connected to the bias contact 8 of the epitaxial well 3, base terminal B1 connected to one end of a second resistor, R3, having the other end connected to the supply voltage Vcc, and collector terminal C2 connected to the ground potential reference GND. A third resistor, R2, has one end connected to the bias contact 8 of the epitaxial well 3 and the other end connected to ground GND. Both electronic switches could also be implemented by two transistors of MOS type, without this entailing any special modifications to the circuit.

The operation of the circuit of FIG. 3 is similar in part to that of the previous circuit embodiment. In fact, if the supply voltage Vcc applied to the node 10 is higher than the value of the threshold voltage Vbe1 of the first transistor T1, the latter, having its base terminal B1 connected to ground via the resistor R1, would be conducting and the node 8, being connected to the bias contact of the well, attains the same potential as the node 10 but for the saturation voltage of the transistor T1. Under this condition, the second transistor T2 is at cutoff because the voltage applied between its base terminal B2 and emitter terminal E2 is below its conduction threshold. If the supply voltage Vcc is less than 0.7 Volts, the conduction threshold of the transistor T1, but more than −0.7 Volts, then both transistors T1, T2 would be at cutoff, and the epitaxial well biased to ground via the resistor R2. On the other hand, if the supply voltage Vcc drops below the value of −0.7 Volts, the first transistor T1 is cut off, but the second transistor T2 goes into saturation to firmly connect the bias contact 8 of the epitaxial well 3 to the ground potential reference GND. Thus, reverse biasing of the parasitic diodes is once again ensured. In fact, should the supply voltage decrease enough to become negative, the ground potential is at that time the highest available potential on the device.

The following chart summarizes the three different conditions of operation of the circuit of FIG. 3 as the supply voltage Vcc changes; in particular, the states of the two transistors T1 and T2, and the value of the output voltage of the circuit Vb applied to the well to be biased, are shown.

| Vcc | T1 | T2 | Vb |
| --- | --- | --- | --- |
| >0.7 | at saturation | at cutoff | = Vcc |
| −0.7 < Vcc < 0.7 | at cutoff | at cutoff | = GND |
| <−0.7 | at cutoff | at saturation | = GND |

In conclusion, the circuit of this invention provides, in a simple manner from the standpoint of its construction, a solution to the problem of the parasitic diodes being turned on in the case of the supply voltage to the device becoming negative with respect to the ground reference.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for biasing epitaxial wells of a semiconductor integrated circuit of the type which includes at least one epitaxial well composed of semiconductor material of a first type and superposed on or adjacent to at least one region of semiconductor material of a second type, comprising at least one electronic switch having first and second terminals and a control terminal, said first terminal being connected to a first potential reference, said second terminal being connected to said epitaxial well and, via a first resistive element, to a second potential reference, and said control terminal being connected, via a second resistive element, to said second potential reference.

2. A circuit according to claim 1, wherein said electronic switch is a bipolar transistor, said first terminal is an emitter terminal, said second terminal is a collector terminal, and said control terminal is a base terminal.

3. A circuit according to claim 2 intended for an integrated circuit which comprises a substrate of the P type, wherein said epitaxial well is of the N type and said region is of the P type, wherein said bipolar transistor is a transistor of the PNP type.

4. A circuit for biasing epitaxial wells of a semiconductor integrated circuit of the type which includes at least one epitaxial well composed of semiconductor material of a first type and superposed on or adjacent to at least one region of semiconductor material of a second type, comprising a first electronic switch having first and second terminals and a control terminal, said first terminal being connected to a first potential reference, said second terminal being connected to said epitaxial well and, via a first resistive element, to a second potential reference, and said control terminal being connected, via a second resistive element, to said second potential reference, and at least a second electronic switch having first and second terminals and a control terminal, said first terminal of said second switch being connected to the epitaxial well, said second terminal being connected to the second potential reference, and said control terminal being connected, via a third resistive element, to the first potential reference.

5. A circuit according to claim 4, wherein said first and second electronic switches are bipolar transistors, said first terminals are emitter terminals, said second terminals are collector terminals, and said control terminals are base terminals.

6. A circuit according to claim 5 intended for an integrated circuit which comprises a substrate of the P type, wherein said epitaxial well is of the N type and said region is of the P type, wherein said first and second bipolar transistors are transistors of the PNP type.

7. A circuit for biasing epitaxial wells of a semiconductor integrated circuit of the type which includes at least one epitaxial well composed of semiconductor material of a first type and superposed on or adjacent to at least one region of semiconductor material of a second type, comprising at least a first electronic switch and a second electronic switch having respective control terminals, the first switch being connected between said epitaxial well and a first potential reference, with the control terminal being coupled to a second potential reference, and the second switch being connected between the epitaxial well and the second potential reference, with the control terminal being coupled to the first potential reference.

8. A circuit according to claim 7, further comprising an integrated resistive element connected between the epitaxial well and the second potential reference.

9. A circuit according to claim 7, wherein said first and second electronic switches are bipolar transistors and said control terminals are base terminals.

10. A circuit according to claim 9 intended for an integrated circuit which comprises a substrate of the P type, wherein said epitaxial well is of the N type and said region is of the P type, wherein said first and second transistors are transistors of the PNP type.

11. A semiconductor integrated circuit comprising at least one epitaxial well composed of a semiconductor material of a first type and superposed on or adjacent to at least one region of a semiconductor material of a second type, comprising a biasing circuit as claim in any of claims 1, 4, and 7.

* * * * *